United States Patent
Pan et al.

(10) Patent No.: US 8,378,364 B2
(45) Date of Patent: Feb. 19, 2013

(54) MULTI-CHIP LIGHT EMITTING DIODE AND METHOD FOR FABRICATING THE SAME

(75) Inventors: Ke-Hao Pan, Taipei (TW); Chun-Cheng Lin, Chiayi (TW)

(73) Assignee: Everlight Electronics Co., Ltd., New Taipei (TW)

(*) Notice: Subject to any disclaimer, the term of this patent is extended or adjusted under 35 U.S.C. 154(b) by 159 days.

(21) Appl. No.: 12/700,102

(22) Filed: Feb. 4, 2010

(65) Prior Publication Data

US 2010/0200876 A1 Aug. 12, 2010

(30) Foreign Application Priority Data

Feb. 6, 2009 (TW) ................. 98103809 A

(51) Int. Cl.
*H01L 33/00* (2010.01)

(52) U.S. Cl. ............... 257/91; 257/98; 257/79; 257/94; 257/99; 257/E33.056; 257/E33.061; 257/E33.067; 438/27; 438/28

(58) Field of Classification Search .......... 257/81, 257/82, 91, 98, 99, 100, 116, 117, 432–437, 257/749, E33.056–E33.059, E25.032, 594, 257/656, 910, E33.046, E27.046, E27.051, 257/E29.327–E29.331, E29.333, E29.219–E29.22

See application file for complete search history.

(56) References Cited

U.S. PATENT DOCUMENTS

| | | | |
|---|---|---|---|
| 5,266,817 A | 11/1993 | Lin | |
| 6,781,160 B1* | 8/2004 | Tsai et al. | 257/98 |
| 7,157,745 B2* | 1/2007 | Blonder et al. | 257/98 |
| 7,994,519 B2* | 8/2011 | Fehrer et al. | 257/86 |
| 2004/0203189 A1* | 10/2004 | Chen et al. | 438/108 |
| 2006/0166391 A1* | 7/2006 | Nemoto | 438/35 |
| 2007/0290230 A1* | 12/2007 | Kawaguchi et al. | 257/196 |
| 2010/0200808 A1* | 8/2010 | Hafiz et al. | 252/301.36 |

FOREIGN PATENT DOCUMENTS

| | | |
|---|---|---|
| CN | 1880835 A | 12/2006 |
| CN | 201069057 Y | 6/2008 |
| DE | 102004021231 A1 | 12/2005 |
| JP | 2001210874 A | 8/2001 |
| JP | 2007227680 A | 9/2007 |
| TW | 595018 B | 6/2004 |
| TW | 200703704 A | 1/2007 |

* cited by examiner

*Primary Examiner* — Mamadou Diallo

(57) ABSTRACT

Multi-chip light emitting diodes and method for fabricating the same are provided. The multi-chip light emitting diode includes a lead frame including a carrier part. A plurality of chips is disposed on the carrier part, wherein the plurality of chips includes a first chip and a second chip. A first scattering layer is conformally covering the first chip to expose electrodes thereof, wherein the first scattering layer consists of a first scattering material. A second scattering layer is conformally covering the second chip to expose electrodes thereof, wherein the second scattering layer consists of a second scattering material.

10 Claims, 5 Drawing Sheets

MULTI-CHIP LIGHT EMITTING DIODE AND METHOD FOR FABRICATING THE SAME

CROSS REFERENCE TO RELATED APPLICATIONS

This application is based upon and claims the benefit of priority from the prior Taiwan Patent Application No. 98103809, filed on Feb. 6, 2009, the entire contents of which are incorporated herein by reference.

BACKGROUND OF THE INVENTION

1. Field of the Invention

The invention relates to a light emitting diode package and method for fabricating the same, and more particularly to a multi-chip light emitting diode package and method for fabricating the same.

2. Description of the Related Art

Light emitting diodes (LEDs) have high brightness, low volume, low power consumption and long operating lifespan and such as, are used in a variety of display products. The luminescent principle of LEDs is as follows. A voltage is applied to a diode to drive an electron and a hole combination. The combination releases light from the diode.

Multi-chip light emitting diodes are generally divided into two-chip light emitting diode and three-chip light emitting diode packages. Using the three-chip light emitting diode as an example, the diode is applied with a driver circuit to radiate a single irradiation or mix all irradiations emitted by individual chips.

In general, the light emitting angle of a multi-chip light emitting diode is determined according to requirement. U.S. Pat. No. 5,266,817 discloses a method for adjusting the light emitting angle of chips on a lead frame. A scattering layer is formed on the bottom and sidewall of a lead frame, and the light emitting angles of the all three chips are adjusted at the same time. However, it is difficult to simultaneously achieve the objective light emitting angle of individual chips via the scattering layer, since the wavelength and location of the three chips may be different.

JP Patent 2001210874 discloses a single-chip light emitting diode package employing a scattering layer, comprising a mixture of resin and fluorescent compounds, covering the surface of the chip. The thickness of the scattering layer, however, is not uniform.

TW patent 595018 discloses single-chip light emitting diode package employing two phosphorescent material layers with different phosphorescent concentrations as a scattering layer, filling into a cavity of a lead frame. The aforementioned prior arts relate to single-chip light emitting diode packages. Note that it is difficult to ensure equal scattering material ratio for per unit resin volume, since the scattering material is mixed with and encapsuled by the resin for a conventional scattering layer. Therefore, the light emitting angle cannot be precisely adjusted by the conventional scattering layer. If the conventional scattering layer is applied in a multi-chip light emitting diode package, each chip of the multi-chip light emitting diode package would not simultaneously achieve the objective light emitting angles since the conventional scattering layer cannot adjust the light emitting angle of each chip individually.

Therefore, it is desirable to devise a novel light emitting diode package that improves upon the aforementioned problems.

BRIEF SUMMARY OF THE INVENTION

An exemplary embodiment of a multi-chip light emitting diode package comprises a lead frame having a carrier part. A plurality of chips is disposed on the carrier part, wherein the plurality of chips at least comprises a first chip and a second chip. A first scattering layer is conformally formed covering the first chip to expose an electrode thereof, wherein the first scattering layer consists of a first scattering material. A second scattering layer is conformally formed covering the second chip to expose an electrode thereof, wherein the second scattering layer consists of a second scattering material.

An exemplary embodiment of a method for fabricating a multi-chip light emitting diode package comprises: providing a lead frame, wherein the lead frame has a carrier part; disposing a plurality of chips on the carrier part of the lead frame, wherein the plurality of chips at least comprises a first chip and a second chip; conformally forming a first scattering layer to cover the first chip to expose an electrode of the first chip, wherein the first scattering layer consists of a first scattering material; and conformally forming a second scattering layer to cover the second chip to expose an electrode of the second chip, wherein the second scattering layer consists of a second scattering material.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The embodiments of the invention provide a multi-chip light emitting diode package and method for fabricating the same The following description is of the best-contemplated mode of carrying out the invention. This description is made for the purpose of illustrating the general principles of the invention and should not be taken in a limiting sense. The scope of the invention is best determined by reference to the appended claims.

Figure 1B:
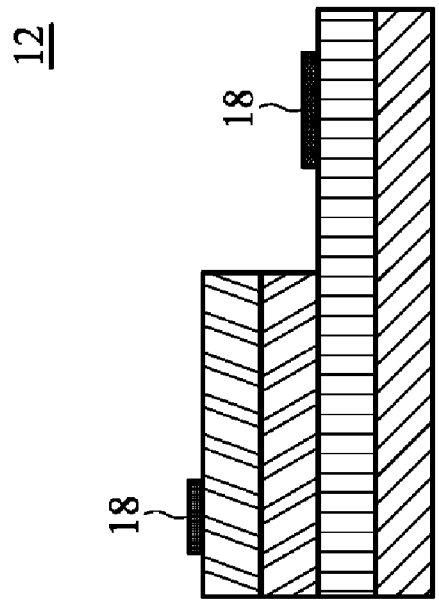
FIGS. 1a-1b are cross sections of chips employed by the multi-chip light emitting diode package of the invention.
Figure 1A:
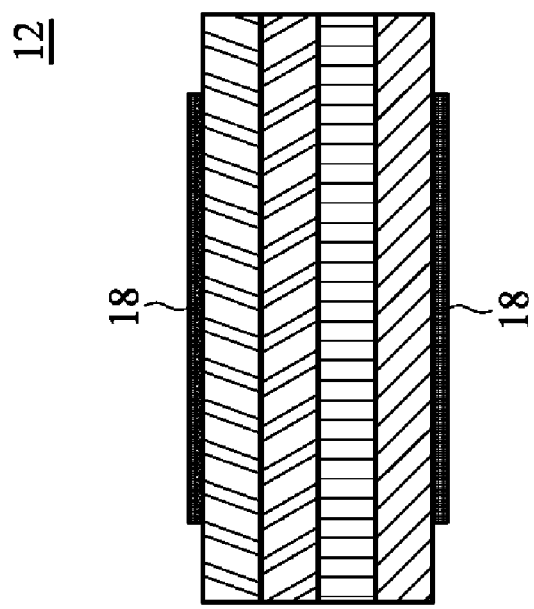
Figure 2:
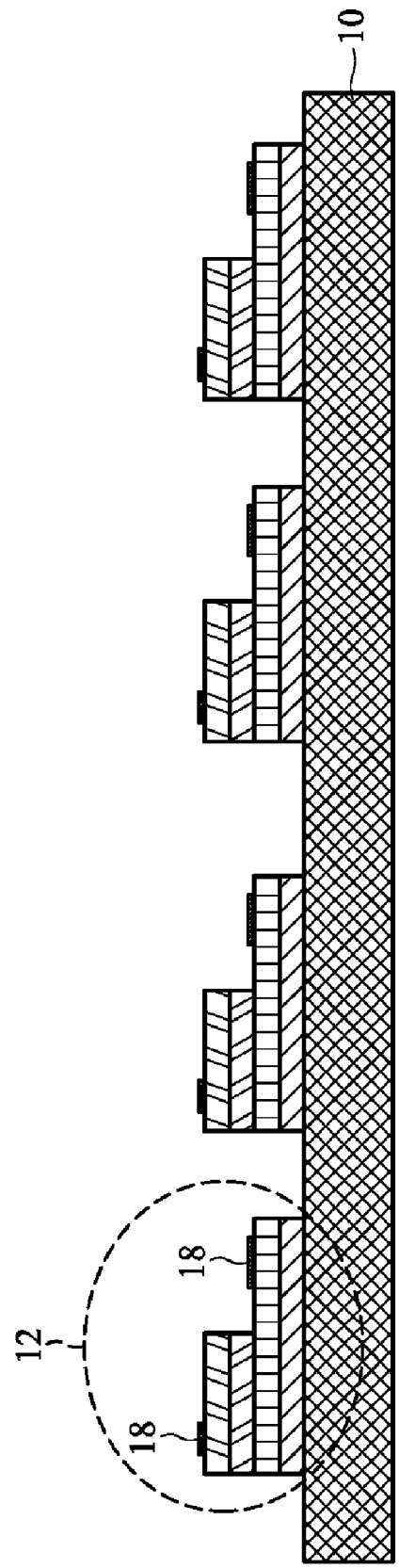
FIGS. 2-4 are cross sections of a method for fabricating a chip with patterned scattering layer according to an embodiment of the invention.

First, before mounting chips on a lead frame, a plurality of first type chip (having single pad (referring to FIG. 1a) or double pads (referring to FIG. 1b)) is disposed on a support 10 (such as a blue film), referring to FIG. 2. Herein, the first type chip 12 can have double pads.

Figure 3:
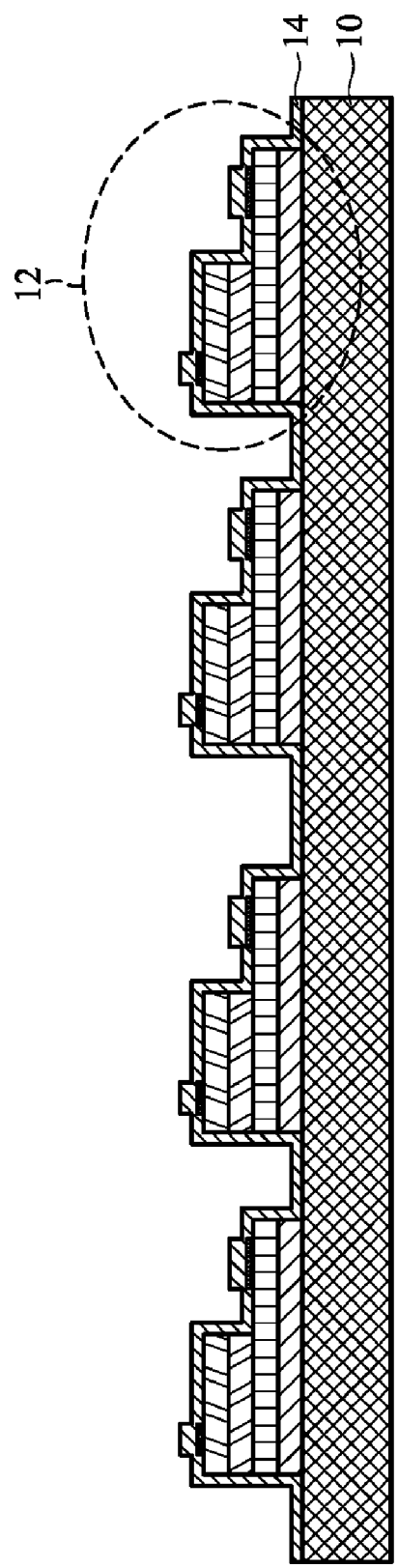

Next, a scattering layer 14 is conformally formed to cover all surfaces, unexposed by the support 10, of the chip 12, as shown in FIG. 3. Particularly, the light emitting angle of the chip 12 can be adjusted by modifying the component and the thickness (T) of the scattering layer 14.

Figure 4:
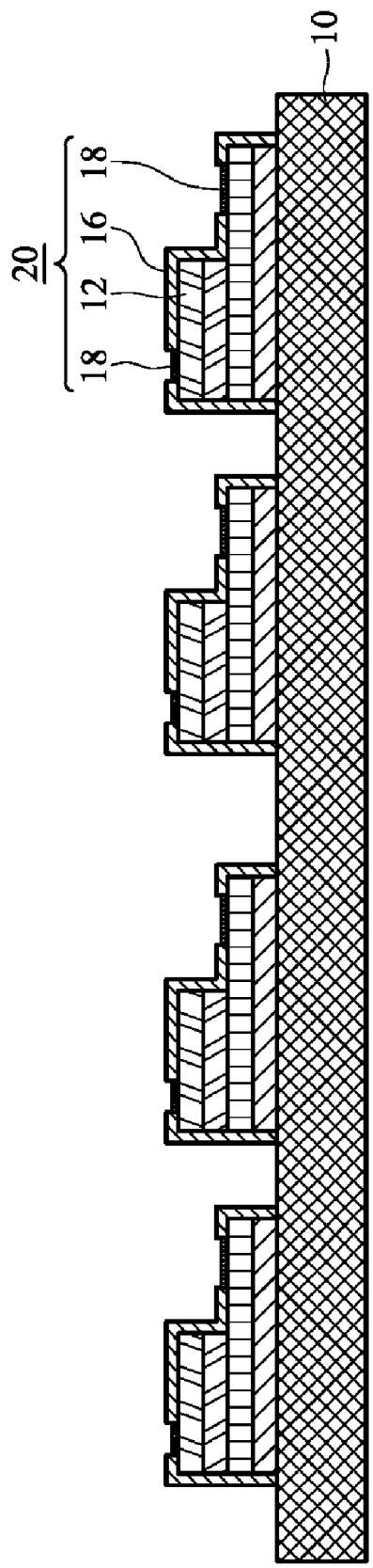

Next, referring to FIG. 4, the scattering layer 14 is patterned to form a first scattering layer 16 (patterned scattering layer), exposing the electrode 18 of the first type chip 12. Next, the chip 12 is removed from the support 10, thus obtaining a first chip 20 according to the invention.

The chips 12 can comprise a sapphire substrate, silicon carbide, or semiconductor substrate, and can be a visible laser diode or invisible laser diode.

The scattering layer 14 consists of a scattering material, and the scattering material does not comprise resin or polymer. Namely, resin or polymer is absent in the scattering layer 14. The scattering material can be a silicon-containing compound (such as silicon oxide, silicon nitride, silicon oxynitride, or silicon carbide), silicon-containing oxide, metal (such as Ag, or Au), metal compound (such as metal oxide), or fluorescent compound. The scattering material can also be nanoscale scattering materials. The method for conformally forming a scattering layer 14 to cover the chip 12 comprises a sol-gel coating, spin coating, chemical vapor deposition, plating, or evaporation method. Further, the method for patterning the scattering layer 14 can comprise a photolithography process, wherein the mask used in the photolithography process comprises positive photoresist, negative photoresist, or blue film.

Next, second type chips and third type chips are fabricated following the above fabrication process of the first type chip 20, wherein the component and the thickness (T) of the scattering layer can be modified to obtain second type chips and third type chips with objective light emitting angles. Accordingly, the first type, second type, and third type chips comprise respectively the first, second, and third scattering layers, and the first, second, and third scattering layers are respectively made of the first, second, and third scattering materials. The first, second, and third scattering materials can be the same or different and all scattering materials do not comprise resin or polymer. The light emitting angle of the first type, second type, and third type chips can be adjusted respectively by modifying thickness and material of corresponding scattering layers. Therefore, each chip exhibits desired light emitting angle even after the encapsulating process, resulting in increased stability of the multi-chip light emitting diode.

Figure 5A:
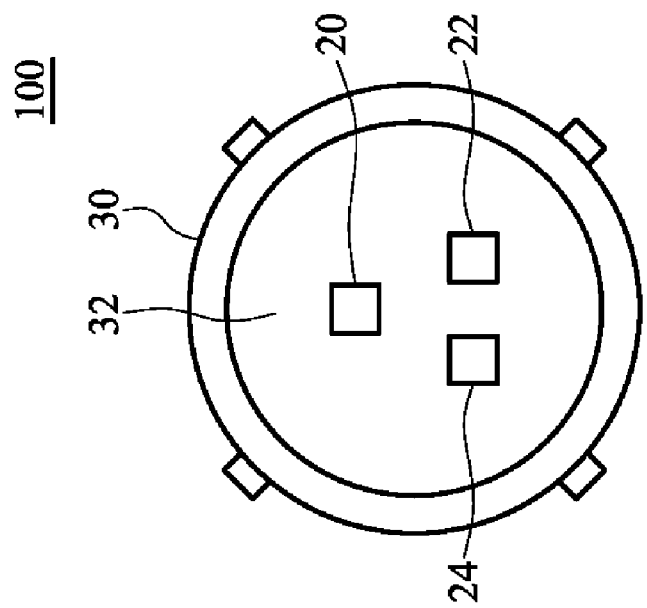
FIGS. 5a and 5b are schematic diagrams of multi-chip light emitting diode package according to embodiments of the invention.
Figure 5B:
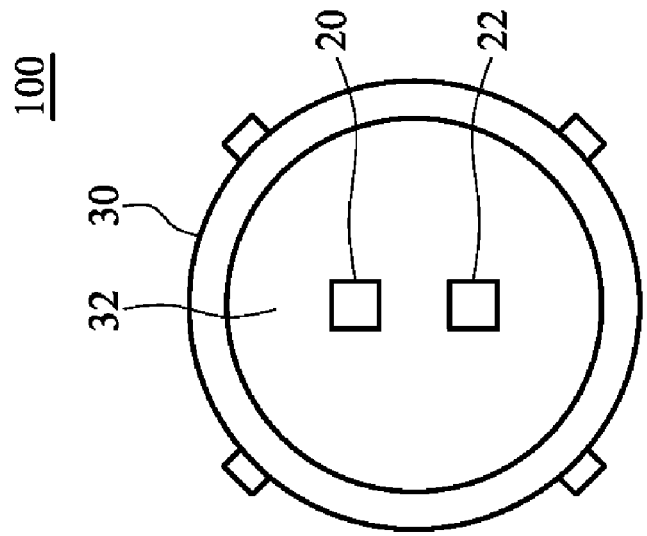

Referring to FIGS. 5a and 5b, the obtained first type chip 20, second type chip 22, and third type chip 24 are disposed on a carrier part 32 of a lead frame 30, thus initialing formation of a muti-chip light emitting diode 100. The muti-chip light emitting diode 100 can be a two-chip light emitting diode (as shown in FIG. 5a), a three-chip light emitting diode (as shown in FIG. 5b), a four-chip light emitting diode, a five-chip light emitting diode etc.

Since the scattering layers consist of scattering materials and do not comprise polymer or resin, it is possible to ensure equal scattering ratio for per unit volume. Further, since the thickness and component of the scattering layers can be modified respectively for corresponding chips, the light emitting angle of each chip can be precisely controlled. Moreover, since the light emitting angle of each chip can be adjusted by modifying the scattering layer rather than increasing additional circuits, the design of a driver circuit can be simplified.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A multi-chip light emitting diode package, comprising:
a lead frame having a carrier part;
a plurality of chips disposed on the carrier part, wherein the plurality of chips at least comprises a first chip and a second chip;
a first scattering layer conformally covering the first chip to expose an electrode thereof, wherein the first scattering layer consists of a first scattering material; and
a second scattering layer conformally covering the second chip to expose an electrode thereof, wherein the second scattering layer consists of a second scattering material, and wherein the first scattering layer is separated from the second scattering layer.

2. The multi-chip light emitting diode package as claimed in claim 1, wherein the first scattering material and the second scattering material are the same or different and are silicon-containing compounds or silicon-containing oxides.

3. The multi-chip light emitting diode package as claimed in claim 2, wherein the silicon-containing compounds or silicon-containing oxides comprises silicon oxide, silicon nitride, silicon oxynitride, or silicon carbide.

4. The multi-chip light emitting diode package as claimed in claim 1, wherein the first scattering material and the second scattering material are the same or different and are metal or metal compounds.

5. The multi-chip light emitting diode package as claimed in claim 4, wherein the metal or metal compounds comprises Ag, Au or oxide thereof.

6. The multi-chip light emitting diode package as claimed in claim 1, wherein the first scattering material and the second scattering material are nanoscale scattering materials.

7. The multi-chip light emitting diode package as claimed in claim 1, wherein the first scattering material and the second scattering material are the same or different and are fluorescent compounds.

8. The multi-chip light emitting diode package as claimed in claim 1, wherein the first chip and the second chip comprise visible laser diodes or invisible laser diodes.

9. The multi-chip light emitting diode package as claimed in claim 8, wherein the thickness of the first scattering layer and the thickness of the second scattering layer are same or different thicknesses and the light emitting angles of the first chip and the second chip are respectively adjusted by the thickness of the first scattering layer and the thickness of the second scattering layer.

10. The multi-chip light emitting diode package as claimed in claim 1, wherein the substrates of the plurality of chips comprises sapphire substrates, silicon carbides, or semiconductor substrates.

* * * * *